(12) United States Patent
Harada et al.

(10) Patent No.: US 10,120,038 B2
(45) Date of Patent: Nov. 6, 2018

(54) VEHICLE LAMP AND METHOD FOR INSPECTING ORGANIC EL ELEMENT

(71) Applicant: Koito Manufacturing Co., Ltd., Tokyo (JP)

(72) Inventors: Tomoaki Harada, Shizuoka (JP); Masaya Shido, Shizuoka (JP); Osamu Kuboyama, Shizuoka (JP); Yoshiro Ito, Shizuoka (JP); Toru Ito, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/583,052

(22) Filed: May 1, 2017

(65) Prior Publication Data

US 2017/0328960 A1 Nov. 16, 2017

(30) Foreign Application Priority Data

May 13, 2016 (JP) .................. 2016-097102

(51) Int. Cl.

| B07C 5/342 | (2006.01) |
|---|---|
| B60Q 1/30 | (2006.01) |
| H01L 51/52 | (2006.01) |
| H01L 25/04 | (2014.01) |
| G01R 31/44 | (2006.01) |
| H01L 51/50 | (2006.01) |
| H01L 51/00 | (2006.01) |

(52) U.S. Cl.
CPC ............. *G01R 31/44* (2013.01); *B07C 5/342* (2013.01); *B60Q 1/30* (2013.01); *H01L 25/048* (2013.01); *H01L 51/0031* (2013.01); *H01L 51/502* (2013.01); *H01L 51/5012* (2013.01); *H01L 51/5271* (2013.01); *H01L 51/52* (2013.01); *H01L 2251/5361* (2013.01)

(58) Field of Classification Search
CPC ............ H05B 33/0896; H05B 33/0815; H05B 33/0806; H05B 33/0812; H05B 33/0842; H05B 33/086; H05B 33/089; H05B 33/0851; C09K 11/06; G01R 31/44; H01L 51/52; G09G 2320/0666; G09G 3/2081; B07C 5/342; B60Q 1/30; F21S 43/14; F21S 43/145; F21S 43/31; F21S 48/214; F21S 48/2212
See application file for complete search history.

(56) References Cited

U.S. PATENT DOCUMENTS

| 6,975,066 | B2 * | 12/2005 | Wakai | ..................... G09F 9/302 313/510 |
|---|---|---|---|---|
| 7,960,920 | B2 * | 6/2011 | Holmes | .............. H05B 33/0815 315/291 |
| 8,132,916 | B2 * | 3/2012 | Johansson | ............... A61B 3/024 351/205 |
| 8,371,696 | B2 * | 2/2013 | Johansson | .............. A61B 3/024 351/205 |

(Continued)

FOREIGN PATENT DOCUMENTS

JP 2015-215995 A 12/2015

*Primary Examiner* — Vibol Tan
(74) *Attorney, Agent, or Firm* — Abelman, Frayne & Schwab

(57) ABSTRACT

Provided is a vehicle lamp including: an organic EL element; and a lighting circuit that applies a voltage to the organic EL device with a rise time of the voltage of 5 milliseconds or less.

5 Claims, 7 Drawing Sheets

(56) References Cited

U.S. PATENT DOCUMENTS

| | | | |
|---|---|---|---|
| 8,779,689 B2 * | 7/2014 | Nerone | H02M 3/156 |
| | | | 315/209 R |
| 9,523,714 B2 * | 12/2016 | Kadyshevitch | G01R 31/305 |
| 9,578,719 B2 * | 2/2017 | Han | G09G 3/006 |
| 9,648,679 B2 * | 5/2017 | Murakami | F21S 48/1757 |
| 9,862,739 B2 * | 1/2018 | Metz | C07F 15/0033 |
| 2017/0292673 A1 * | 10/2017 | Ito | F21S 43/13 |

* cited by examiner

VEHICLE LAMP AND METHOD FOR INSPECTING ORGANIC EL ELEMENT

CROSS-REFERENCE TO RELATED APPLICATIONS

This application is based on and claims priority from Japanese Patent Application No. 2016-097102, filed on May 13, 2016 with the Japan Patent Office, the disclosure of which is incorporated herein in its entirety by reference.

TECHNICAL FIELD

The present disclosure relates to a vehicle lamp and a method for inspecting an organic EL element.

BACKGROUND

Conventionally, there has been known a vehicle lamp including a planar light-emitting body constituted by an organic EL element (see, e.g., Japanese Patent Laid-Open Publication No. 2015-215995).

SUMMARY

The present inventors have intensively studied on a vehicle lamp provided with an organic EL element and recognized that the reliability of the vehicle lamp may be lowered due to the organic EL element.

The present disclosure has been made in consideration of the circumference, and the present disclosure is to provide a technology of enhancing the reliability of a vehicle lamp on which an organic EL element is mounted.

In order to solve the above-described problem, according to an aspect, the present disclosure provides a vehicle lamp. The vehicle lamp includes an organic EL element; and a lighting circuit that applies a voltage to the organic EL element with a rise time of the voltage of 5 milliseconds or less. According to this aspect, the reliability of the vehicle lamp may be enhanced.

In the aspect, the rise time may be 1 millisecond or less. Further, in the aspect, the organic EL element may include a first electrode, a second electrode, and an organic layer interposed between the first electrode and the second electrode, and the organic layer may contain only conductive particles having a size smaller than a thickness of the organic layer. According to this aspect, the reliability of the vehicle lamp may be further enhanced.

According to another aspect, the present disclosure provides a method for inspecting an organic EL element. The method includes applying a voltage to the organic EL element by setting a rise time of the voltage to be equal to or higher than a predetermined threshold value determined based on a temperature environment where the organic EL element is placed, or setting the rise time to 10 milliseconds or more regardless of the temperature environment where the organic EL element is placed; and determining whether or not the organic EL element is defective based on a lighting state of the organic EL element by the application of the voltage. According to this aspect, the reliability of the vehicle lamp may be enhanced. In the aspect, the organic EL element may be placed in a temperature environment of −40° C. Accordingly, the reliability of the vehicle lamp may be further enhanced.

According to still another aspect, the present disclosure provides a vehicle lamp. The vehicle lamp includes an organic EL element including an electrode and an organic layer; and a lighting circuit that applies a voltage to the organic EL element with a rise time of the voltage shorter than a time until the electrode peeled off from the organic layer due to a burned mark generated in the organic layer comes into contact with the burned mark due to a Coulomb force generated by the application of the voltage to the organic EL element. Accordingly, the reliability of the vehicle lamp may be enhanced.

According to the present disclosure, it is possible to enhance the reliability of the vehicle lamp on which the organic EL element is mounted.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, preferred exemplary embodiments of the present disclosure will be described with reference to the drawings. Further, the exemplary embodiments are not intended to limit the present disclosure thereto, but are merely illustrative. All features described in the exemplary embodiments or combinations thereof may not be essential for the present disclosure. Identical or corresponding components, members, and processes in each of the drawings will be denoted by the same symbols, and overlapping descriptions thereof will be appropriately omitted. In addition, a scale or a shape of each component illustrated in each of the drawings is conveniently set in order to facilitate descriptions thereof and should not be construed as being limited unless otherwise specified. Further, the terms such as, for example, "first" and "second" used herein or the claims are not intended to refer to any order or importance but are intended to discriminate a component from another component.

Figure 1:
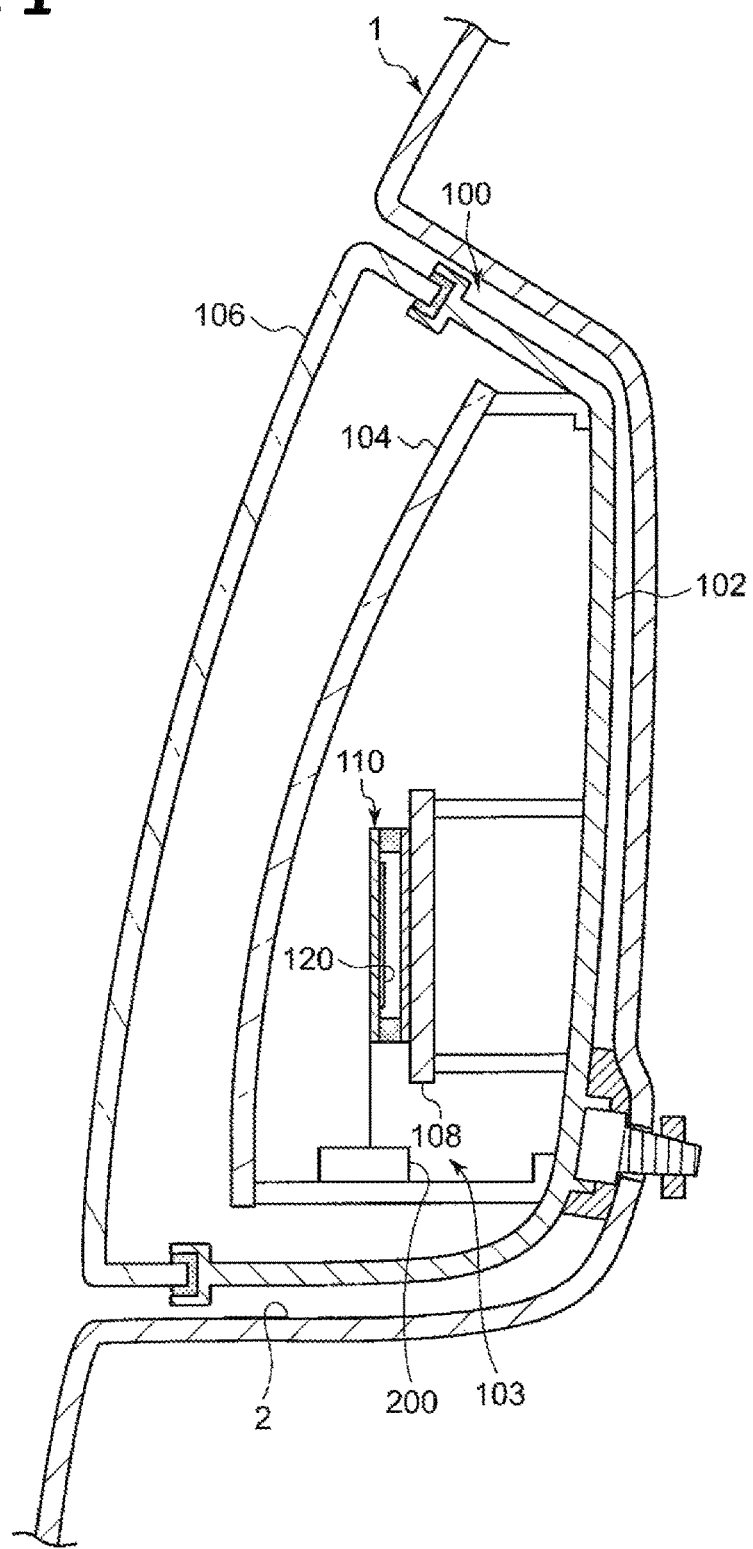
FIG. 1 is a vertical-sectional view illustrating a schematic configuration of a vehicle lamp according to an exemplary embodiment.

FIG. 1 is a vertical-sectional view illustrating a schematic configuration of a vehicle lamp according to an exemplary embodiment. The vehicle lamp 100 according to the exemplary embodiment is, for example, a tail lamp mounted on a rear portion of a vehicle. The vehicle lamp 100 is fixed to a rear panel 1 of the vehicle. Specifically, the rear panel 1 includes a recess 2 recessed toward the front side of the vehicle, and the vehicle lamp 100 is accommodated in the recess 2. The vehicle lamp 100 is fixed to a rear panel 1 in a state of being accommodated in the recess 2.

The vehicle lamp 100 includes a lamp body 102 and a light-transmitting cover 104. The lamp body 102 is a casing having an opening at the vehicle rear side (the front side of the lamp). The light-transmitting cover 104 is attached to the lamp body 102 to cover the opening of the lamp body 102. The light-transmitting cover 104 is formed of, for example, a light-transmitting resin or glass, and functions as an inner cover (inner lens). An outer cover (outer lens) 106 constituting an outer casing of the vehicle lamp 100 is provided at the lamp front side of the light-transmitting cover 104. An opening of the recess 2 is closed by the outer cover 106.

A lamp chamber 103 is formed by the lamp body 102 and the light-transmitting cover 104. A light source 110 and a lighting circuit 200 are accommodated in the lamp chamber 103. The light source 110 is mounted on a bracket 108. The bracket 108 is fixed to the lamp body 102. A voltage is applied to the light source 110 by the lighting circuit 200. The lighting circuit 200 may be provided outside the lamp chamber 103.

Figure 2:
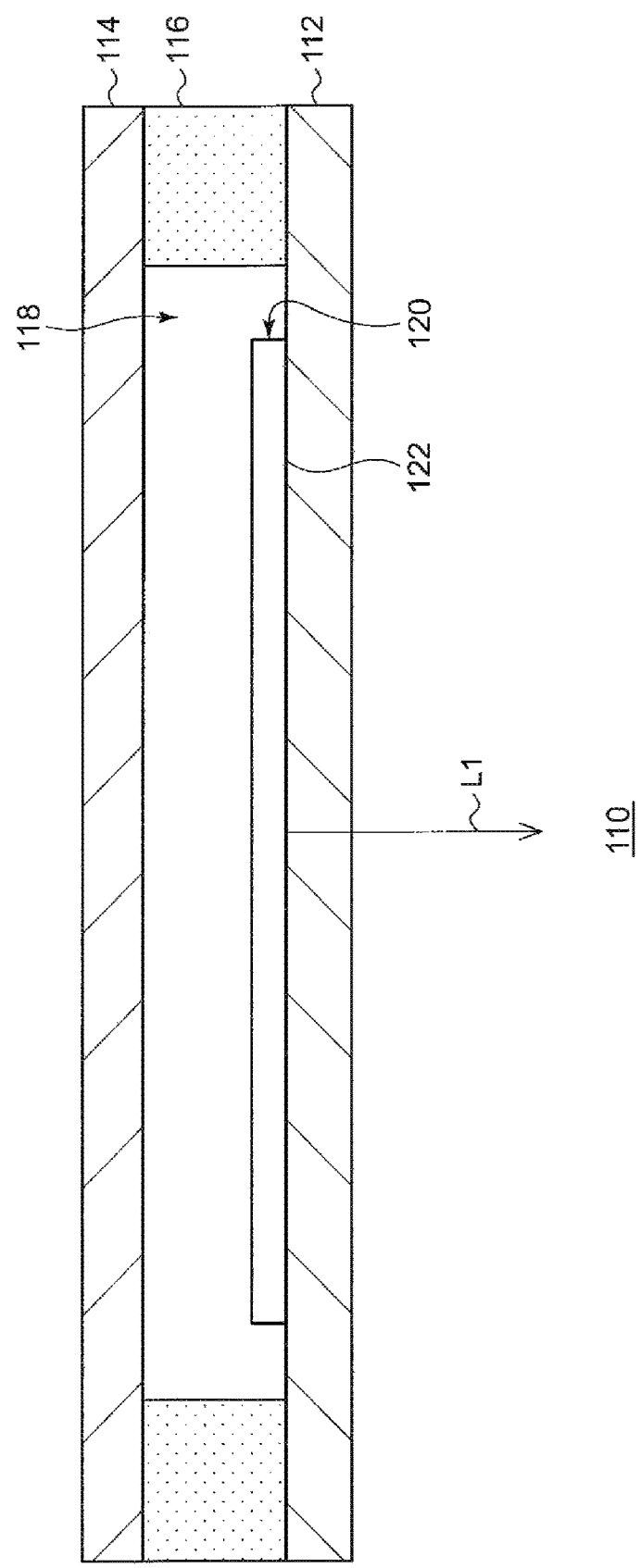
FIG. 2 is a cross-sectional view illustrating a schematic structure of a light source.

FIG. 2 is a cross-sectional view illustrating a schematic structure of a light source 110. The light source 110 includes a first substrate 112, a second substrate 114, and a sealant 116. The sealant 116 is interposed between the first substrate 112 and the second substrate 114 at the peripheral portions of the first substrate 112 and the second substrate 114. The first substrate 112, the second substrate 114, and the sealant 116 are made of conventionally known materials. For example, the first substrate 112 and the second substrate 114 are glass substrates or light-transmitting resin substrates. The sealant 116 is, for example, an adhesive that fixes the first substrate 112 and the second substrate 114.

An inner space 118 is defined by the first substrate 112, second substrate 114, and the sealant 116. An organic EL element 120 is accommodated in the inner space 118. The organic EL element 120 is a conventionally known general organic EL element, and has a light emitting surface 122. A light L1 emitted from the light emitting surface 122 is irradiated to the front side of the lamp through the first substrate 112. The structure of the light source 110 is not particularly limited, but the light source 110 may have a structure in which the organic EL element 120 is mounted on the main surface of the substrate, and the top surface and the side surface of the organic EL element 120 are covered with a sealant.

Figure 3:
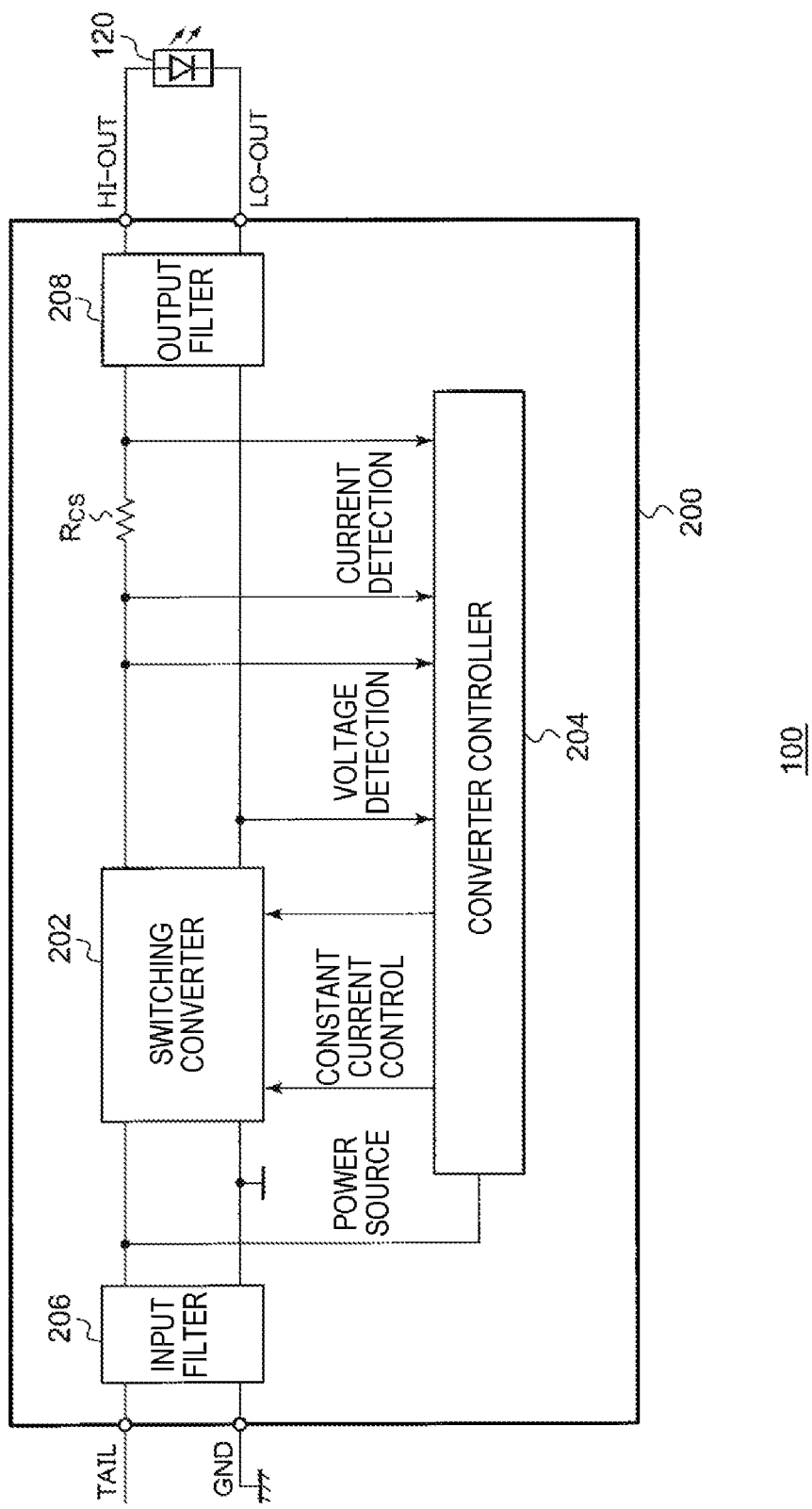
FIG. 3 is a block diagram of the vehicle lamp according to the exemplary embodiment.

FIG. 3 is a block diagram of the vehicle lamp according to the exemplary embodiment. In the vehicle lamp 100 according to the exemplary embodiment, for example, a hysteresis control (bang-bang control) excellent in high-speed response is adopted. The vehicle lamp 100 includes the organic EL element 120 and the lighting circuit 200. The lighting circuit 200 includes a switching converter 202, a converter controller 204, an input filter 206, and an output filter 208.

The switching converter 202 receives a battery voltage $V_{BAT}$ (also referred to as an input voltage $V_{IN}$) from a battery via an input filter 206 and supplies a lamp current (driving current) $I_{LAMP}$ to the organic EL element 120 via the output filter 208. For example, the switching converter 202 is a step-up/step-down chopper type DC/DC converter, and includes, for example, a switching transistor, a diode, and an inductor. The input filter 206 removes electromagnetic noise input from a battery. The output filter 208 removes ripple of the lamp current $I_{LAMP}$.

The converter controller 204 performs a constant current control and functions as an output overvoltage protection circuit and an output overcurrent protection circuit. The converter controller 204 detects the lamp current $I_{LAMP}$ and adjusts a switching duty ratio of the switching transistor included in the switching converter 202 such that the lamp current $I_{LAMP}$ matches a target current $I_{REF}$ corresponding to a target light amount of the organic EL element 120. The converter controller 204 is a hysteresis control type controller and includes, for example, a current detection circuit, a hysteresis comparator, and a driver. A current detection resistor (hereinafter, referred to as a sense resistor) $R_{CS}$ is inserted on the path of the lamp current $I_{LAMP}$. A voltage drop proportional to the lamp current $I_{LAMP}$ occurs in the sense resistor $R_{CS}$. The current detection circuit of the converter controller 204 generates a current detection signal $V_{CS}$ that indicates the current lamp current $I_{LAMP}$ based on the voltage drop of the sense resistor $R_{CS}$.

The hysteresis comparator of the converter controller 204 compares the current detection signal $V_{CS}$ with two threshold signals $V_{THL}$ and $V_{THH}$ determined according to the reference voltage $V_{REF}$ and generates a control pulse $S_{CNT}$ according to the comparison result. Specifically, the control pulse $S_{CNT}$ transits to a first level when the current detection signal $V_{CS}$ reaches the upper threshold signal $V_{THH}$ corresponding to a peak value $I_{PEAK}$ of the lamp current $I_{LAMP}$, and transits to a second level when the current detection signal $V_{CS}$ reaches the lower threshold signal $V_{THL}$ corresponding to a bottom value $I_{BOTTOM}$ of the lamp current $I_{LAMP}$. The driver of the converter controller 204 drives the switching transistor of the switching converter 202 based on the control pulse $S_{CNT}$. The lamp current $I_{LAMP}$ goes back and forth between the peak value $I_{PEAK}$ and the bottom value $I_{BOTTOM}$ so that the organic EL element 120 emits light with a luminance corresponding to the average value $I_{REF}$ of the peak value $I_{PEAK}$ and the bottom value $I_{BOTTOM}$ (two threshold signals $V_{THH}$ and $V_{THL}$).

The organic EL element 120 is able to implement uniform surface emission. Further, the organic EL element 120 has a relatively high flexibility, and may take, for example, a curved shape. Further, the whole of the organic EL element 120 is substantially transparent. Thus, when the organic EL element 120 is used for the light source 110, the design of the vehicle lamp 100 may be enhanced. In addition, since the organic EL element 120 is thin and lightweight, the vehicle lamp 100 may be reduced in depth dimension. Also, the vehicle lamp 100 may become lightweight. Further, the organic EL element 120 has a lower light directivity than that of, for example, a LED. Thus, the visibility of the vehicle lamp 100 may be enhanced. In addition, it is possible to implement the vehicle lamp 100 that hardly imparts glare to, for example, drivers of other vehicles.

Meanwhile, the present inventors have intensively and repetitively studies on the vehicle lamp 100 including the organic EL element 120, and have found that the reliability of the vehicle lamp 100 may be lowered due to the organic EL element 120. That is, the organic EL element 120 often contains conductive particles as foreign matters, and there is a possibility that the lighting of the organic EL element 120 is hindered by the conductive particles. As a result, the reliability of the vehicle lamp 100 is lowered. FIGS. 4A to 4D are schematic views for explaining a mechanism of occurrence of non-lighting in the organic EL element 120. FIGS. 4A to 4D illustrate a region including conductive particles 140 in the organic EL element 120 in an enlarged scale.

Figure 4A:
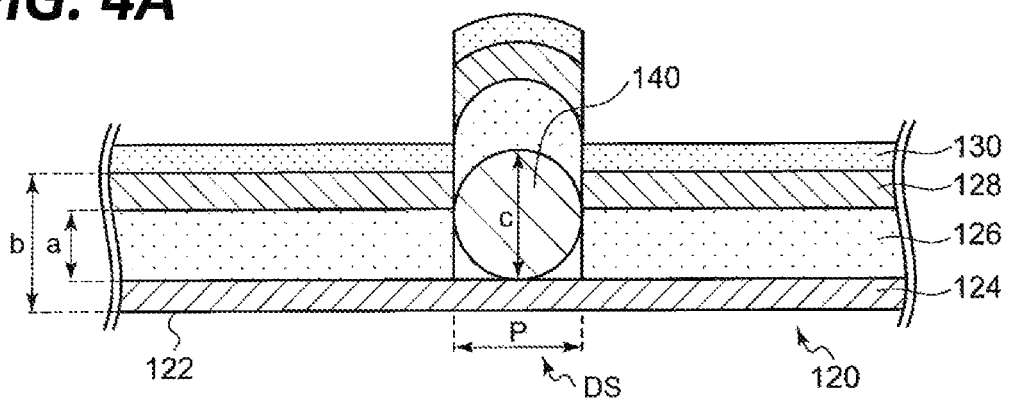
FIGS. 4A to 4D are schematic views for explaining a mechanism of occurrence of non-lighting in the organic EL element.

As illustrated in FIG. 4A, the organic EL element 120 includes a first electrode 124, an organic layer 126, a second electrode 128, and an inorganic sealing layer 130. For example, the first electrode 124 is an anode, and the second electrode 128 is a cathode. Further, the first electrode 124 is a transparent electrode made of, for example, ITO, and the second electrode 128 is a metal electrode, for example, an aluminum electrode obtained by depositing aluminum on the organic layer 126. The organic layer 126 is a light emitting layer disposed between the first electrode 124 and the second electrode 128. The inorganic sealing layer 130 is made of, for example, silicon nitride ($SiN_x$), silicon oxide ($SiO_x$), or aluminum oxide ($AlO_x$), and functions as a barrier layer against, for example, moisture or oxygen. The inorganic sealing layer 130 prevents moisture or oxygen, which has entered the inner space 118 from an outer space, from coming in contact with, for example, the second electrode 128. A thickness a of the organic layer 126 is, for example, about 500 nm, and a thickness b of the sum of the first electrode 124, the organic layer 126, and the second electrode 128 is, for example, about 1 μm.

During the manufacture of the organic EL element 120, when the organic layer 126 is laminated on the first electrode 124, a conductive particle 140 present in the chamber may adhere to the first electrode 124. In a region of the first electrode 124 to which the conductive particle 140 adheres, the organic layer 126, the second electrode 128, and the inorganic sealing layer 130 are laminated on the conductive particles 140. The conductive particle 140 includes those having, for example, a size larger than a distance between the first electrode 124 and the second electrode 128, in other words, the thickness of the organic layer 126. For example, the size of the conductive particle 140 is about 800 nm. The size c of the conductive particle 140 is defined as the longest one of straight lines connecting two points at the outer edges of the conductive particle 140.

Figure 4B:
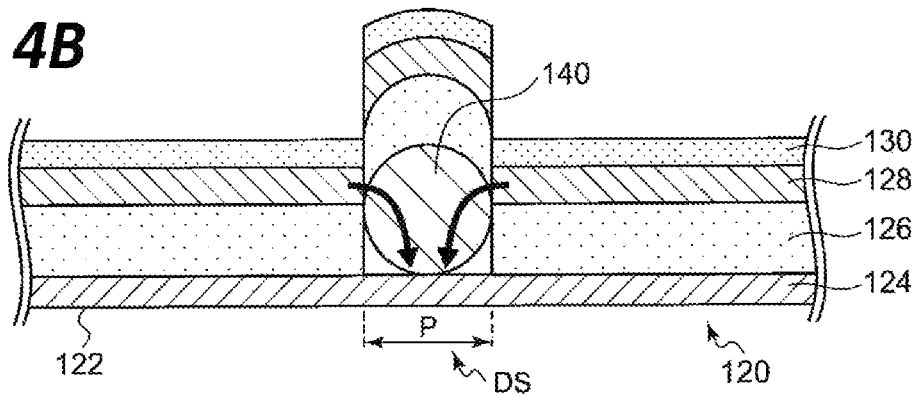
Figure 4C:
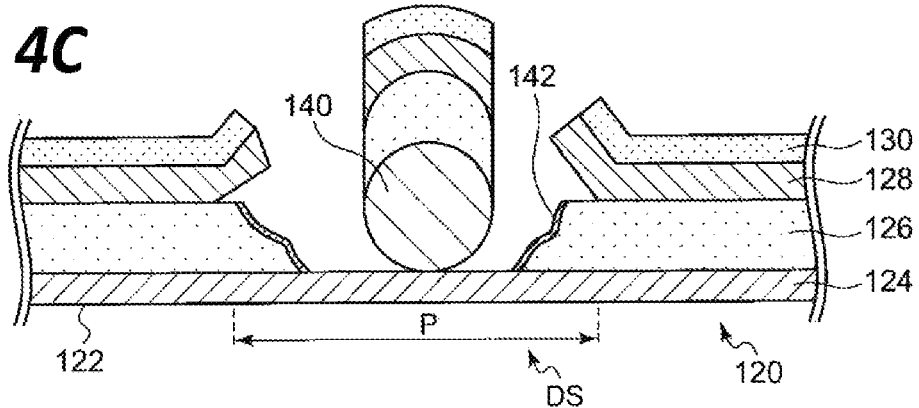

When a voltage is applied to the organic EL element 120 including the conductive particle 140, as illustrated in FIG. 4B, the conductive particle 140 becomes a leak path so that short-circuit occurs between the first electrode 124 and the second electrode 128. When short-circuit occurs, a part of the organic layer 126 may be burned so that a burned mark 142 is generated, as illustrated in FIG. 4C. Further, a part of the second electrode 128 may be burned or peeled off. The burned mark 142 may form a part of the leak path. Thus, the occurrence of the burned mark 142 increases the possibility of short-circuit between the first electrode 124 and the second electrode 128. The organic EL element 120 may not be lit on in some cases due to the short-circuit between the first electrode 124 and the second electrode 128 via the conductive particle 140 or the burned mark 142. When the organic EL element 120 is not lit, the reliability of the vehicle lamp 100 is lowered.

Figure 4D:
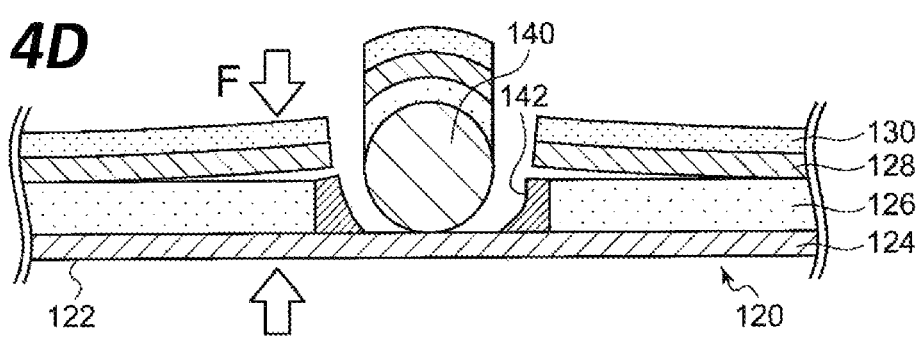

That is, in the state illustrated in FIG. 4C, the second electrode 128 and the burned mark 142 are separated from each other. Thus, in the organic layer 126, a region where the conductive particle 140 and the burned mark 142 extend and a region excluding burned and peeled portions of the second electrode 128 are able to emit light. However, as illustrated in FIG. 4D, when the peeled portion of the second electrode 128 is attracted to the organic layer 126 side by, for example, the generation of the Coulomb force F (to be described below) and comes into contact with the burned mark 142, the first electrode 124 and the second electrode 128 may be short-circuited, so that the entire organic EL element 120 is not lit.

The present inventors have found that the occurrence of the non-lighting depends on the rise time of a voltage applied to the organic EL element 120. That is, when a voltage is applied to the organic EL element 120, charges are accumulated in the organic EL element 120 up to the voltage value Vfa (see FIGS. 6A, 6B, 7A, and 7B) at which the current rapidly starts to rise. The accumulation of charges causes a Coulomb force F to be generated between the first electrode 124 and the second electrode 128. Or, the Coulomb force F is generated between the two electrodes and the conductive particle 140 or the burned mark 142. Due to this Coulomb force F, the two electrodes and the conductive particle 140 or the burned mark 142 are displaced in a direction approaching each other. Thus, short-circuit between the first electrode 124 and the second electrode 128 via the conductive particle 140 or the burned mark 142 is likely to occur. As the rise time of the voltage is slow, the time to reach the voltage value Vfa is prolonged. Thus, since a state where short-circuit is likely to occur is continued for a longer time, the possibility of non-lighting is increased.

Further, the present inventors have found that the occurrence of the non-lighting also depends on the environmental temperature (atmosphere temperature) at which the organic EL element 120 is placed. When the environmental temperature of the organic EL element 120 becomes a low temperature, non-lighting tends to easily occur. That is, when the environmental temperature of the organic EL element 120 is low, the constituent members of the organic EL element 120 contract. As a result, the first electrode 124, the second electrode 128, and the conductive particle 140 or the burned mark 142 are displaced in the direction approaching each other. Thus, since short-circuit between the first electrode 124 and the second electrode 128 via the conductive particle 140 or the burned mark 142 is likely to occur, the possibility of non-lighting is increased.

Figures 5A, 5B:
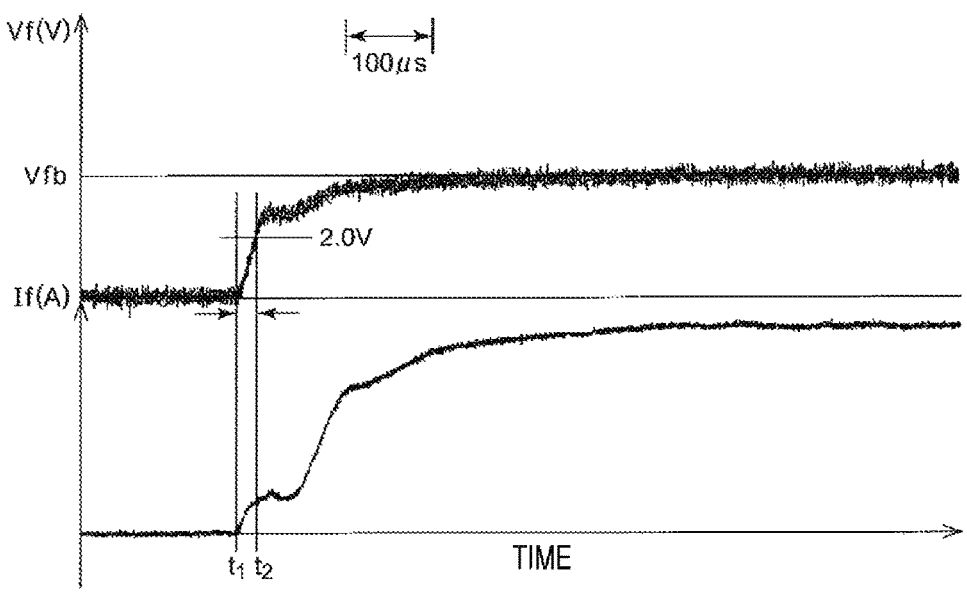
FIG. 5A is a table illustrating a relationship between an environmental temperature and a rise time of a voltage with respect to the occurrence of non-lighting.
FIG. 5B is a graph illustrating an example of changes in an output current and an output voltage.

The present inventors investigated the occurrence of non-lighting in the organic EL element 120 by varying the environmental temperature and the rise time of the voltage. FIG. 5A is a table illustrating a relationship between an environmental temperature and a rise time of a voltage with respect to the occurrence of non-lighting. FIG. 5B is a graph illustrating an example of changes in an output current and an output voltage. In FIG. 5A, the symbol "X" indicates that the organic EL element 120 was not lit, and the symbol "O" indicates that the organic EL element 120 was lit. The environmental temperature is set to be 70° C. which is a temperature assuming a use state of the vehicle lamp 100, 25° C. which is a temperature assuming a non-use state of the vehicle lamp 100, and −40° C. which is the minimum temperature assumed in the use environment of the vehicle lamp 100. In FIG. 5B, the upper stage represents a change in output voltage Vf, and the lower stage represents a change in output current If. The horizontal axis is common to the upper and lower stages, and represents time. In addition, "Vfb" represents a voltage at the steady state.

As illustrated in FIG. 5A, in the case where the environmental temperature was 70° C., the organic EL element 120 was lit when the rise time of the voltage was 5 milliseconds or less. That is, it was possible to avoid the non-lighting of the organic EL element 120. Further, in the case where the environmental temperature was 25° C., it was possible to avoid the non-lighting of the organic EL element 120 when the rise time of the voltage was 3 milliseconds or less. Further, in the case where the environmental temperature was −40° C., it was possible to avoid the non-lighting of the organic EL element 120 when the rise time of the voltage was 1 millisecond or less. At any environmental temperature, the organic EL element 120 was not lit when the rise time of the voltage was 10 milliseconds or more.

From the investigation result, it has been confirmed that when the rise time of the voltage is 5 milliseconds or less, the non-lighting of the organic EL element 120 may be avoided at least at some environmental temperatures. Therefore, in the vehicle lamp 100 according to the exemplary embodiment, the lighting circuit 200 applies a voltage to the organic EL element 120 with a rise time of the voltage of 5 milliseconds or less. The rise time of the voltage is defined as a time ranging from a current value required for the voltage applied to the organic EL element 120 to become a specified lighting state of the organic EL element 120, that is, a voltage value corresponding to 10% of the target current IREF (the voltage value at a time $t_1$ in FIG. 5B) to a voltage value corresponding to 90% (the voltage value at a time $t_2$ in FIG. 5B). Therefore, the time ranging from time $t_1$ to time $t_2$ in FIG. 5B is the rise time of the voltage.

When the lighting circuit 200 applies a voltage to the organic EL element 120 with the rise time of the voltage of 5 milliseconds or less, it is possible to suppress the non-lighting of the organic EL element 120 in at least some of the temperature environment. Further, the rise time of the voltage may be 1 millisecond or less. This makes it possible to suppress the non-lighting of the organic EL element 120 at any environmental temperature of the organic EL element 120.

In addition, the organic layer 126 of the organic EL element 120 may include only the conductive particles 140 having the size c smaller than the thickness a of the organic layer 126. Thus, it is possible to reduce the possibility of occurrence of short-circuit between the first electrode 124 and the second electrode 128 via the conductive particles 140. Therefore, the non-lighting of the organic EL element 120 may be further suppressed. In this case, the thickness a of the organic layer 126 may be a thickness when the organic EL element 120 is placed in an environment of −40° C. Further, the thickness a of the organic layer 126 may be obtained, for example, by measuring the length of the organic layer 126 in the stacking direction of the first electrode 124, the organic layer 126, and the second electrode 128 at a predetermined number of places, and averaging the obtained values.

When the rise time of the voltage is shortened to 5 milliseconds or less, it is also possible to suppress defective appearance of the vehicle lamp 100. That is, as illustrated in FIG. 4A, the conductive particle 140 itself becomes a non-light emitting point DS also called a dark spot. Further, as illustrated in FIG. 4C, the burned mark 142 or a burned or peeled portion of the second electrode 128 also becomes a part of the non-light emitting point DS. Therefore, the non-light emitting point DS expands due to the short-circuit between the first electrode 124 and the second electrode 128.

The organic EL element 120 has been supposed to be used for a general illumination lamp until now. In the case of the general illumination lamp, the organic EL element 120 is rarely viewed directly. In addition, even when the organic EL element 120 is viewed directly, the organic EL element 120 is located relatively far from an observer. Further, the life required for the general illumination lamp is much shorter than that of the vehicle lamp 100. Therefore, in the general illumination lamp, the size P of the non-light emitting point DS which is allowable for use is larger than that of the vehicle lamp 100, and the growth of the non-light emitting point DS is not a problem.

In contrast, in the case of the vehicle lamp 100, the organic EL element 120 is often viewed directly. In addition, the organic EL element 120 is often viewed directly by an observer from a close position as compared with the general illumination lamp. Further, it is assumed that the use period (i.e., the end of use) of the vehicle lamp 100 is much longer than that of the general illumination lamp, i.e., 10 years, further 15 years. Therefore, even when the non-light emitting point DS has a size P that is acceptable for use before use of the vehicle lamp 100, the non-light emitting point DS may expand to a size P that is unacceptable depending on the use, that is, to a size P that causes defective appearance.

In the exemplary embodiment, when the rise time of the voltage is set to 5 milliseconds or less, the situation where short-circuit easily occurs may be caused in a short time. This makes it possible to suppress the occurrence or expansion of the burned mark 142. Thus, it is possible to suppress the expansion of the non-light emitting point DS. As a result, the defective appearance of the vehicle lamp 100 may be suppressed.

Further, there is provided a method for inspecting the organic EL element 120 based on the relationship among the environmental temperature, the rise time of the voltage, and the occurrence of non-lighting in the organic EL element 120, which has been found by the present inventors. The method for inspecting the organic EL element 120 according to the exemplary embodiment includes applying a voltage to the organic EL element 120 by setting a rise time of the voltage to be equal to or higher than a predetermined threshold value determined based on a temperature environment where the organic EL element is placed, or setting the rise time to 10 milliseconds or more regardless of the temperature environment where the organic EL element 120 is placed; and determining whether or not the organic EL element 120 is defective based on a lighting state of the organic EL element 120 by the application of the voltage.

Based on FIG. 5A, the threshold value of the rise time of the voltage used in the voltage applying step is more than 5 milliseconds, preferably 10 milliseconds or more when the temperature environment of the organic EL element 120 is 70° C. Further, the threshold value is more than 3 milliseconds, preferably 5 milliseconds or more when the temperature environment of the organic EL element 120 is 25° C. Further, the threshold value is more than 1 millisecond, preferably 2 milliseconds or more when the temperature environment of the organic EL element 120 is −40° C. In the defective article determining step, when the organic EL element 120 is in a non-lighting state, it is determined that the organic EL element 120 is defective.

Even though the conductive particle 140 has a size which is difficult to visually recognize with the naked eyes (e.g., 50 µm or less), the conductive particle may cause non-lighting. Therefore, an organic EL element 120 that may lower the reliability of the vehicle lamp 100 may be more reliably removed by applying a voltage at a predetermined rise time capable of inducing non-lighting to confirm the lighting state of the organic EL element 120. Thus, the reliability of the vehicle lamp 100 may be enhanced.

The method for inspecting the organic EL element 120 may include placing the organic EL element 120 in a temperature environment of −40° C. or less. The organic EL element 120 is placed in a low temperature environment of −40° C. or less when the voltage applying step is performed. The non-lighting of the organic EL element 120 may be more easily induced by placing the organic EL element 120 in a low temperature environment. Therefore, the inspection accuracy may be further enhanced.

Further, the presence of the conductive particles 140 which cause the non-lighting, that is, the conductive particles 140 which is larger than the distance between the electrodes (which may also be referred to as the presence of the burned marks 142), may be detected based on the voltage versus current characteristics (so-called V-I curve) when a voltage is applied to the organic EL element 120. FIGS. 6A, 6B, 7A, and 7B are graphs each illustrating a result of measurement of the voltage versus current characteristics of the organic EL element 120.

Figure 6A:
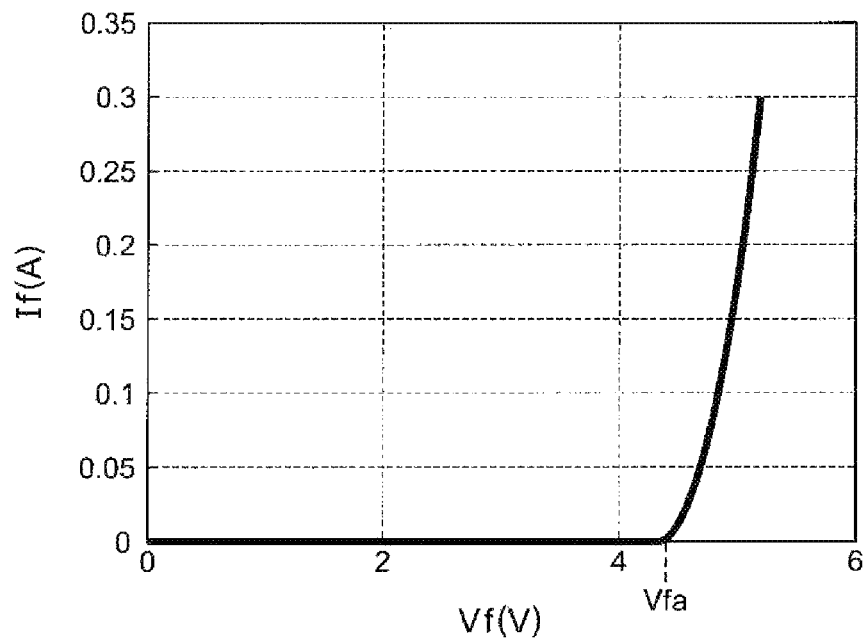
FIGS. 6A and 6B are graphs illustrating a result of measurement of the voltage versus current characteristics of the organic EL element.
Figure 6B:
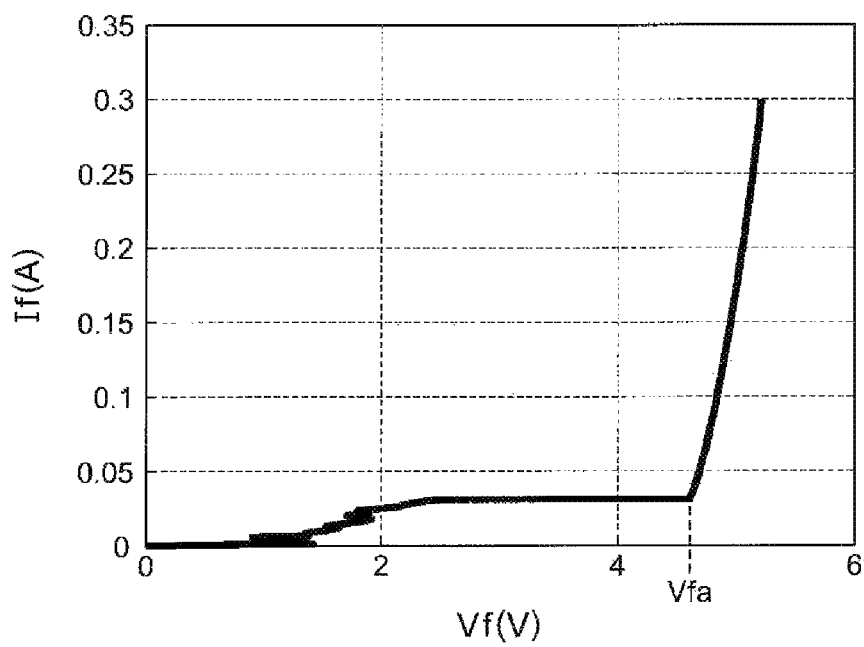
Figure 7A:
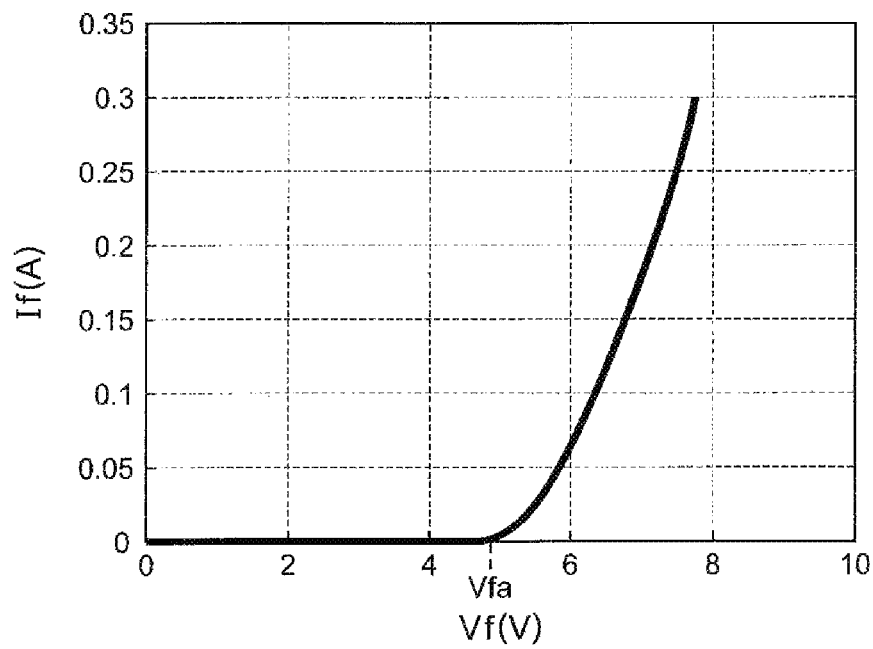
FIGS. 7A and 7B are graphs illustrating a result of measurement of the voltage versus current characteristics of the organic EL element.
Figure 7B:
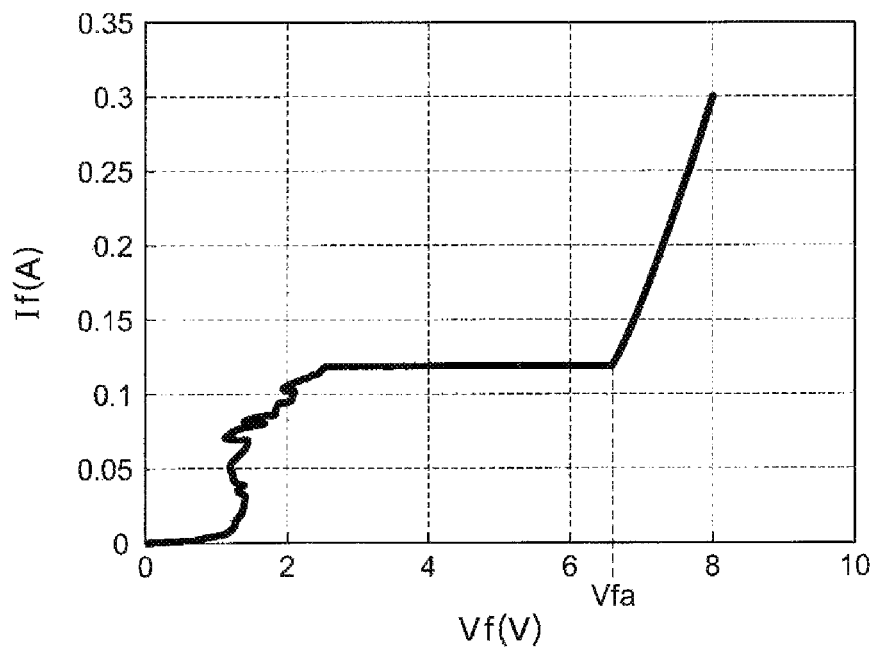

FIGS. 6A and 6B illustrate the voltage versus current characteristics when the temperature environment of the organic EL element 120 is set to normal temperature (25° C.). FIGS. 7A and 7B illustrate the voltage versus current characteristics when the temperature environment of the organic EL element 120 is set to −40° C. In addition, the voltage versus current characteristics illustrated in FIGS. 6A and 7A are those in the case where the organic EL element 120 does not include the conductive particles 140, which cause non-lighting, and the voltage versus current characteristics illustrated in FIGS. 6B and 7B are those in the case where the organic EL element 120 includes the conductive particles 140 which cause non-lighting. The rise time of the voltage is the same.

As illustrated in FIGS. 6A and 7A, in the case where the conductive particles 140 causing the non-lighting do not exist, the current value is 0 until the voltage value Vfa at which the current starts to rise sharply. Meanwhile, as illustrated in FIGS. 6B and 7B, in the case where the conductive particles 140 causing the non-lighting exist, a slight current flows until the applied voltage reaches the voltage value Vfa. Therefore, the presence of the conductive particle 140 causing non-lighting may be detected based on the change in the current value at a voltage value less than the voltage value Vfa. Thus, the reliability of the vehicle lamp 100 may be enhanced. Further, defective appearance may be suppressed.

In addition, as illustrated in FIGS. 6B and 7B, as the environmental temperature of the organic EL element 120 is decreased, the change in current value at a voltage value lower than the voltage value Vfa is increased. Therefore, the conductive particles 140, which cause the non-lighting, may be detected with higher accuracy by setting the temperature environment of the organic EL element 120 to a lower temperature.

As described above, the vehicle lamp 100 according to the exemplary embodiment includes an organic EL element 120 and a lighting circuit 200 that applies a voltage to the organic EL element 120 with a rise time of the voltage of 5 milliseconds or less. Thus, since the non-lighting of the organic EL element 120 may be suppressed, the reliability of the vehicle lamp 100 may be enhanced. Further, the reliability of the vehicle lamp 100 may be further enhanced by setting the rise time of the voltage to 1 millisecond or less. Further, the organic EL element 120 includes only conductive particles 140 smaller than the thickness of the organic layer 126 in the organic layer 126. Thus, the reliability of the vehicle lamp 100 may be further enhanced. Further, the non-lighting of the organic EL element 120 may also be suppressed by applying an overshoot current to the organic EL element 120.

The method for inspecting the organic EL element 120 includes applying a voltage to the organic EL element 120 by setting a rise time of the voltage to be equal to or higher than a predetermined threshold value determined based on a temperature environment where the organic EL element is placed, or setting the rise time to 10 milliseconds or more regardless of the temperature environment where the organic EL element 120 is placed; and determining whether or not the organic EL element 120 is defective based on a lighting state of the organic EL element 120 by the application of the voltage. This makes it possible to exclude an organic EL element 120 that may not be lit during its use. Thus, the reliability of the vehicle lamp 100 may be enhanced. Further, the inspection method includes placing the organic EL element 120 in a temperature environment of −40° C. or less. In this case, the reliability of the vehicle lamp 100 may be further enhanced.

Further, according to the exemplary embodiment, there is provided a vehicle lamp 100 including an organic EL element 120 including an electrode and an organic layer 126; and a lighting circuit 200 that applies a voltage to the organic EL element 120 with a rise time of the voltage shorter than a time until the electrode peeled off from the organic layer 126 due to a burned mark 142 generated in the organic layer 126 comes into contact with the burned mark 142 due to a Coulomb force generated by the application of the voltage to the organic EL element 120.

The vehicle lamp 100 may be, for example, a marker lamp (e.g., a turn signal lamp, a daytime running lamp, or a clearance lamp), a head lamp, or a brake lamp.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A vehicle lamp comprising:
    an organic EL element; and
    a lighting circuit that applies a voltage to the organic EL device with a rise time of the voltage of 5 milliseconds or less,
    wherein the organic EL element includes a first electrode, a second electrode, and an organic layer interposed between the first electrode and the second electrode, and
    the organic layer contains only conductive particles having a size smaller than a thickness of the organic layer.

2. The vehicle lamp of claim 1, wherein the rise time is 1 millisecond or less.

3. A method of inspecting an organic EL element, comprising:
    applying a voltage to the organic EL element by setting a rise time of the voltage to be equal to or higher than a predetermined threshold value determined based on a temperature environment where the organic EL element is placed, or setting the rise time to 10 milliseconds or more regardless of the temperature environment where the organic EL element is placed; and
    determining whether or not the organic EL element is defective based on a lighting state of the organic EL element by the application of the voltage.

4. The method of claim 3, wherein in the applying the voltage to the organic EL element, the organic EL element is placed in a temperature environment of −40° C.

5. A vehicle lamp comprising:
an organic EL element including an electrode and an organic layer; and
a lighting circuit that applies a voltage to the organic EL element with a rise time of the voltage shorter than a predetermined time until the electrode peeled off from the organic layer due to a burned mark generated in the organic layer comes into contact with the burned mark due to a Coulomb force generated by the application of the voltage to the organic EL element.

* * * * *